United States Patent
Narayanan et al.

(10) Patent No.: US 9,397,685 B1
(45) Date of Patent: Jul. 19, 2016

(54) SENSOR WITH LOW POWER MODEL BASED FEATURE EXTRACTOR

(71) Applicant: Texas Instruments Incorporated, Dallas, TX (US)

(72) Inventors: Sriram Narayanan, Richardson, TX (US); Srinath Mathur Ramaswamy, Murphy, TX (US); Arup Polley, Richardson, TX (US); Ajit Sharma, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/806,826

(22) Filed: Jul. 23, 2015

(51) Int. Cl.
*H03M 1/00* (2006.01)
*H03M 1/12* (2006.01)

(52) U.S. Cl.
CPC .................................. *H03M 1/1245* (2013.01)

(58) Field of Classification Search
CPC ..... H03M 1/12; H03M 1/1245; H03M 1/124; H03M 1/001; H03M 1/06; H03M 1/18; H03M 1/188; H03M 1/662; H03M 1/10; H03M 1/468
USPC ........................... 341/118, 120, 122, 132, 155
See application file for complete search history.

(56) References Cited

U.S. PATENT DOCUMENTS

| | | | |
|---|---|---|---|
| 6,172,635 B1 * | 1/2001 | Nakamura | H03M 1/188 341/155 |
| 6,900,750 B1 * | 5/2005 | Nairn | H03M 1/0621 341/118 |
| 7,042,629 B2 * | 5/2006 | Doerr | G01J 11/00 341/137 |
| 7,786,915 B1 | 8/2010 | Kiper et al. | |
| 8,125,253 B2 | 2/2012 | Goldman et al. | |
| 8,140,027 B2 | 3/2012 | Ozgun et al. | |
| 9,071,267 B1 * | 6/2015 | Schneider | H03M 1/188 |
| 2002/0008654 A1 * | 1/2002 | Sakakibara | H03M 1/1225 341/162 |
| 2002/0105339 A1 * | 8/2002 | Nagaraj | G11C 27/02 324/601 |
| 2007/0247347 A1 * | 10/2007 | Matsui | H03M 1/002 341/155 |
| 2009/0121790 A1 * | 5/2009 | Brown | G01R 19/04 330/279 |
| 2009/0235146 A1 * | 9/2009 | Tan | H03M 13/6331 714/780 |
| 2012/0306673 A1 * | 12/2012 | Ueno | H03M 1/0612 341/118 |
| 2013/0262036 A1 | 10/2013 | Narayanan et al. | |
| 2015/0002324 A1 | 1/2015 | Sharma et al. | |

* cited by examiner

*Primary Examiner* — Linh Nguyen
(74) *Attorney, Agent, or Firm* — John R. Pessetto; Frank D. Cimino (57) ABSTRACT

Described examples include low power analog front end circuits for sensing repeating signal waveforms, including a first sampling circuit to sample an input signal, an analog detector circuit to provide a detector output signal representing a feature of the input signal, a second sampling circuit to sample the detector output signal, and a control circuit to control a sample rate or other analog front end operating parameter at least partially according to the sampled detector output signal, and to selectively enable and disable the analog detector circuit at least partially according to a model representing an expected repeating waveform of the input signal.

20 Claims, 6 Drawing Sheets

SENSOR WITH LOW POWER MODEL BASED FEATURE EXTRACTOR

TECHNICAL FIELD

The present disclosure relates to sensing apparatus and more particularly to low power adaptive model-based circuits.

BACKGROUND

Battery-powered consumer electronics and other low-power devices often include analog front-end circuitry to receive input signal such as voltages or currents for sampling and digital conversion for further analysis or processing. For example, wrist worn electronic devices monitor a user's heart rate and provide an output value indicating a number of beats per minute. An analog front-end circuit receives an analog voltage input signal from a sensor or transducer and on-board processing circuitry digitizes sample values and counts peak values as a function of time to compute a heart rate value for display to the user. Such mixed-signal circuits include both analog and digital circuitry drawing current from a limited-power battery source. Thus, reducing power consumption is an important goal for achieving commercially acceptable overall product size, cost and weight as well as for extending the time between required battery replacements and/or battery charging operations. These goals are also facilitated by reduced memory requirements for the digital circuitry to store obtained digital sample values. Certain battery-powered devices also provide wireless communications capabilities to transfer digital samples to an external host system. Reducing the number of signal samples reduces the wireless bandwidth required to communicate converted signal data values or computed heart rate values and thus further conserves battery power.

SUMMARY

In described examples, a sensor apparatus includes an analog front-end circuit with a first sampling circuit to sample an input signal, an analog detector circuit to provide a detector output signal representing a feature of the input signal, and a second sampling circuit to sample the detector output signal. The apparatus also includes a control circuit to control a sample rate or other operating parameter of the analog front end at least partially according to the sampled detector output signal, and the control circuit selectively enables and disables the analog detector circuit at least partially according to a model representing an expected repeating waveform of the input signal.

In other described examples, a method of conserving power in a sample circuit includes automatically determining a waveform model at least partially according to a sampled input signal, and disabling an analog feature detector circuit while sampling the input signal at a first sample rate. The method further includes selectively enabling the analog feature detector circuit and sampling a feature detector circuit output signal representing a feature of the input signal when the model indicates a probability that the feature detector circuit output signal is greater than a threshold, disabling the analog feature detector circuit after sampling the feature detector circuit output signal, and selectively sampling the input signal at a higher second sample rate if the sampled feature detector circuit output signal exceeds a second threshold associated with the model.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

Figure 1:
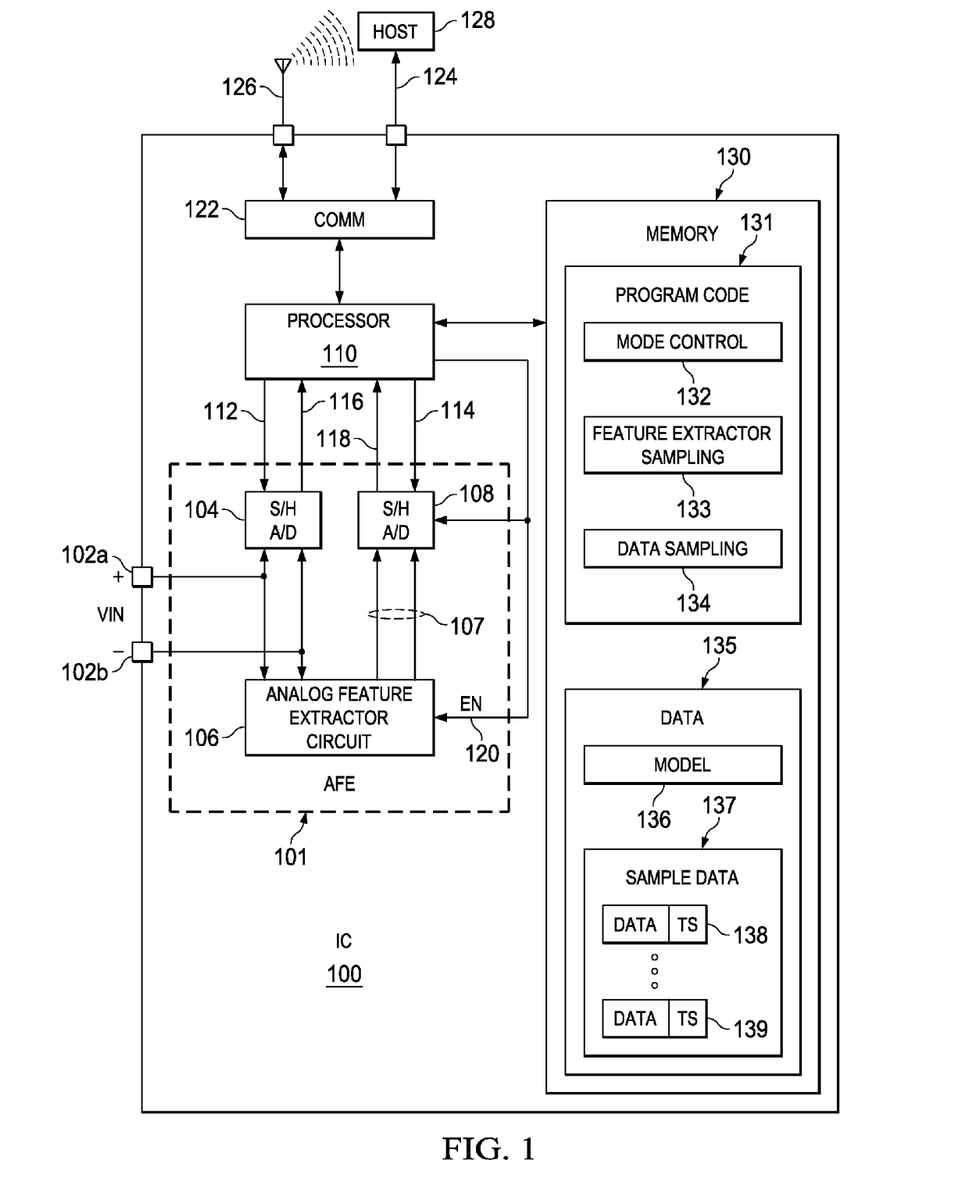
FIG. 1 is a schematic diagram of a sensor apparatus in an integrated circuit (IC) with an analog feature detector circuit selectively operated by a processor of a control circuit according to a model.
Figure 2:
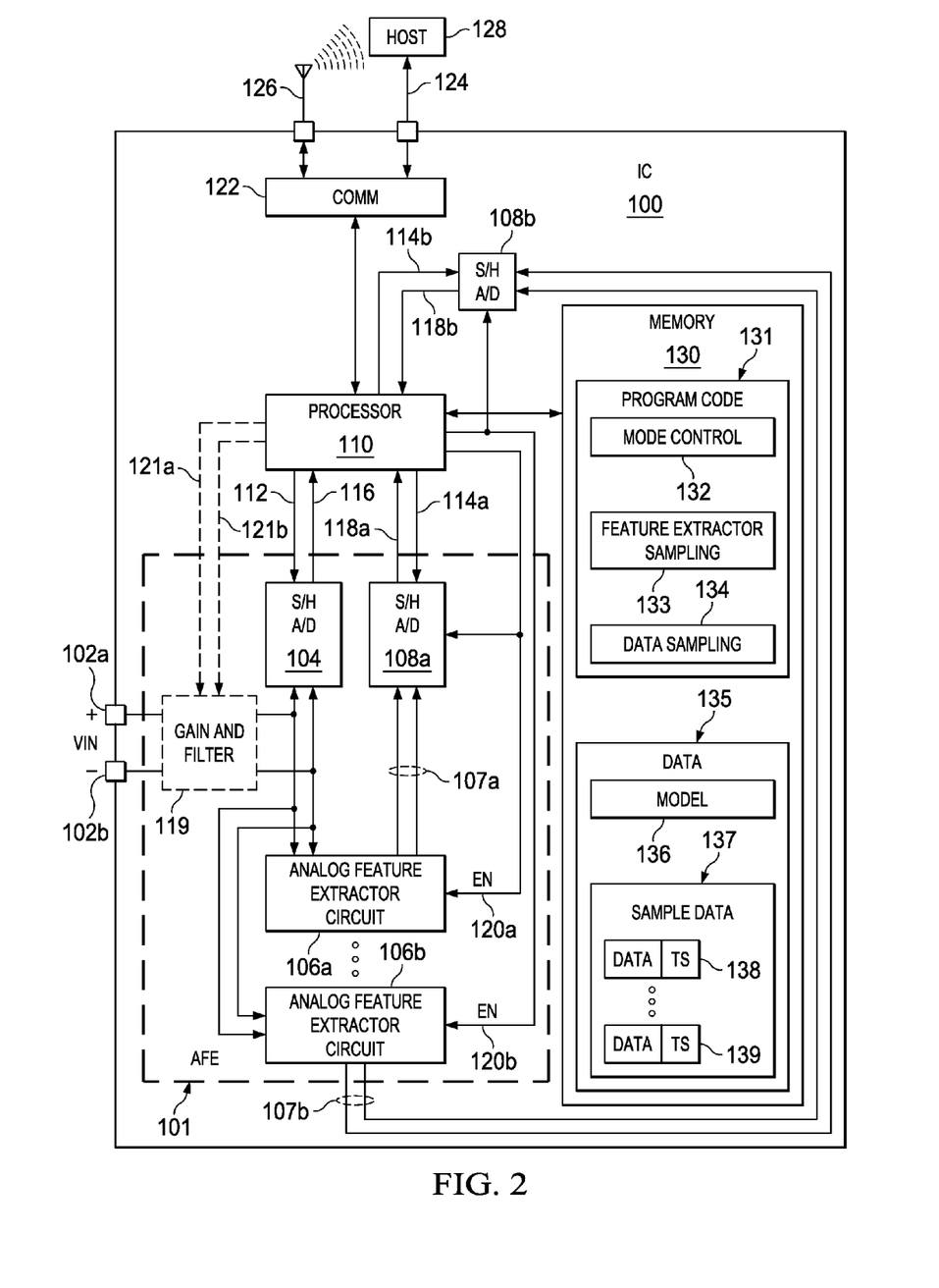
FIG. 2 is a schematic diagram of another sensor apparatus example with multiple analog feature extractor circuits and an adaptable front-end filter circuit.

FIGS. 1 and 2 show two low power sensor apparatus examples formed in integrated circuits (ICs) 100. The sensor apparatus 100 can be used in analog to digital conversion applications as well as circuits and systems providing analytical metrics or values based on analysis of converted digital values corresponding to an input signal VIN. In one example, the apparatus 100 can be used for processing biometric signal such as ECG input signals for determining and monitoring a user's heart rate, although the various concepts of the disclosed examples can be used in a variety of different applications. The apparatus 100 provides means for conserving power in such applications, and may facilitate operation of front-end circuitry in battery-powered user electronics or other host systems.

The sensor apparatus 100 of FIG. 1 includes an analog front-end (AFE) circuit 101 as well as a control circuit including a processor 110, an electronic memory 130 and a communications circuit 122. The AFE circuit 101 includes an input circuit with positive and negative input terminals 102a and 102b coupleable to an external sensor or transducer (not shown) to receive an input signal. In the illustrated example, the input signal is a differential voltage VIN. In other examples, the input circuit receives a single ended voltage or current signal. The AFE circuit 101 includes a first sampling circuit 104, such as a sample hold (S/H) circuit coupled with the input circuit 102a, 102b to sample the input signal VIN. The first sampling circuit 104 provides a first sample signal 116 representing the input signal VIN according to a first sampling control signal 112 from the processor 110 of the control circuit.

The AFE circuit 101 also includes an analog detector circuit 106, referred to herein as a feature extractor circuit, which is selectively operated by the control circuit processor 110 according to a model 136 stored in the control circuit memory 130. In particular, the analog detector circuit 106 in one example provides dual mode operation, with a first mode in which the circuit 106 provides an analog detector output signal 107 representing a feature of the input signal VIN. In a second mode, the analog detector circuit 106 enters a low-power operating condition, referred to herein as "disabled". In addition, the analog detector circuit 106 is operated in one of these two modes based on the state of an enable signal 120 (labeled EN in the drawing) received from the processor 110.

The analog detector circuit 106 can include any suitable circuitry to receive the input signal VIN and provide a single ended or differential voltage or current output representing at least one feature of the received signal VIN. When enabled, the analog detector circuit 106 in one example provides the detector output signal 107 representing an energy of the input signal VIN. In another example, the detector output signal 107 represents a rate of change of the input signal VIN. In a further example, the detector output signal 107 represents a root mean square RMS of the input signal VIN. In further examples of the analog detector circuit 106, the detector output signal 107 can represent an absolute value or any feature or characteristic of the input signal VIN. In the illustrated example, the analog detector circuit 106 provides the detector output signal 107 as a differential output voltage when enabled, although other examples are possible in which the detector circuit 106 provides a detector output signal as an analog current or voltage, whether differential or single ended.

The AFE circuit 101 further includes a second sampling circuit 108, shown as a sample hold circuit in FIG. 1. The second sampling circuit 108 is coupled to receive and sample the detector output signal 107 from the analog detector circuit 106. In addition, the second sample circuit 108 provides a second sample signal 118 representing the detector output signal 107 according to a second sampling control signal 114 from the processor 110.

The control circuit formed by the processor 110 and associated electronic memory 130 is operatively coupled with the AFE circuit 101. The processor 110 in one example provides the sampling control signals 112 and 114 to selectively operate the sample hold circuits 104 and 108. In addition, the processor 110 receives analog sample hold output signals 116 and 118 from the sample hold circuits 104 and 108. In this example, the processor 110 is a microcontroller unit (MCU) including internal analog to digital conversion circuitry to convert the received analog signals 116 and 118 into corresponding digital values respectively representing the sampled input signal 116 representing the input voltage VIN and the sampled detector output signal 118 representing a feature of the input signal VIN. In certain examples, the AFE circuit 101 is integrated with the control circuit into a single IC 100.

In one example, the processor 110 stores the converted digital values 138, 139 associated with the input voltage signal VIN as sample data 137 in a data portion 135 of the electronic memory 130. The data portion 135 of the memory 130 also stores the model 136 representing an expected repeating waveform of the input signal VIN. In one example, the model 136 is a Markov model used by the processor 110 to capture or quantify states and state transition probabilities. The processor 110 constructs or updates the model 136 in a training or learning mode (e.g., 302 in FIG. 3 below), and associates individual model states with one or more values for at least one AFE operating parameter. The memory 130 further includes a program code or instruction portion 131 including a mode control program 132, a feature extractor sampling program 133 and a data sampling control program 134.

The processor 110 in one example stores multiple samples in the sampled data 137, including example words 138 and 139. Each data word 138, 139 in this example includes a multibit data field (e.g., 14 bits in one example), and a single or multibit "timestamp" field (labeled TS in FIG. 1). In one example, the control circuit processor 110 provides the sample data 137 to an external host device 128 using the communications circuit 122. The communications circuit 122 in one example communicates with the host device 128 using a wired connection 124. In another example, the communications circuit 122 communicates with the host device 128 using a wireless connection including a transmit antenna 126 or other suitable wireless communications circuitry. In one example, the processor 110 provides the sample data 137 to the host system 128 via the communications circuit 122. In some examples, the processor 110 computes a characteristic of the repeating input signal waveform VIN based on the sample data 137 (e.g., a heart rate value), and provides one or more digital values to the host system 128 representing the characteristic of the input signal waveform using the communications circuit 122.

The processor 110 controls sampling of the input data 116 using the sample hold circuit 104 according to the data sampling program instructions 134 in the memory 130. The processor 110 operates the first sample hold circuit 104 via the first sample control signal 112 at least partially according to the model 136 stored in the data portion 135 of the memory 130. The processor 110 operates according to the feature extractor sampling program instructions 133 to provide the second sampling control signal 114 to control sampling of the feature detector output (FDO) data 107 from the second sample hold circuit 108. The processor 110 also controls the selective disabling and enabling of the analog feature extractor circuit 106 and the second sample hold circuit 108 through generation of one or more enable signals 120 according to the program instructions 132 and/or 133 for selective power conservation in the apparatus 100.

In addition, the processor 110 in one example selectively changes the sampling rate SR of the input sampling according to the mode control program instructions 132 based on the model 136 in the memory 130. In one example, the processor 110 provides timestamp fields to indicate a selected sampling rate SR corresponding to a given one of the data samples 138, 139. In one example, two different sampling rates (e.g., HI and LO) are used, with a single bit timestamp field TS indicating which of the two sampling rates corresponds to a given sample data word 138, 139. In other examples, more than two different sampling rates can be used, with a multibit timestamp field TS being encoded to represent the particular sampling rate corresponding to a given data word 138, 139.

The control circuit processor 110 in FIG. 1 receives the first and second sample signals 116, 118 from the AFE circuit 101 and controls at least one operating parameter of the AFE circuit 101 at least partially according to the second sample signal 118. In one embodiment shown in FIG. 1, the processor 110 controls the sampling rate SR operating parameter of the AFE circuit 101 for sampling the input signal VIN using the first sampling control signal 112 provided to the first sample hold circuit 104 at least partially according to the second sample signal 118 representing the analog feature detector output signal 107. For example, the model 136 for an ECG or other repeating signal waveform indicates portions or states for which the input signal VIN changes more rapidly than for other portions, and the processor 110 adjusts the input sample rate SR according to the model state. The model 136 in one example is a Markov model that associates corresponding portions of the repeating waveform modeled during a training or learning mode with different input signal sampling rates SR.

In addition, the model 136 provides probabilities at any given time during a normal or test mode operation indicating the probability P that the feature detector output signal 107 is greater than a first threshold TH1. When the probability P exceeds the first threshold TH1 according to the model 136, the processor 110 enables or wakes up the analog detector circuit (feature extractor) 106 and the second sample hold circuit 108 using the enable signal 120, and provides the second sampling control signal 114 to convert the second sample signal 118. In this manner, the processor 110 implements the feature extractor sampling program 133 to keep the analog detector circuit 106 and the second sampling circuit 108 in a low-power operating mode until the model 136 indicates a relatively high probability that the input signal feature sensed by the analog detector circuit 106 will indicate a potential change in the state of the input signal VIN. If this expectation or probability is confirmed by a subsequent reading of the feature signal 107 via the second sample signal 118, the processor 110 changes the input signal sampling rate by adjusting the provision of the first sampling control signal 112 when the second sample signal 118 indicates a change in the behavior of the input signal waveform meriting a change in the sampling rate.

The model-based operation in one example reduces power consumption of the AFE circuit 101 while reducing the data sampling rate SR and reducing the corresponding amount of data memory 135 required to store corresponding sample words 138, 139 in a first control mode when the input signal VIN is expected to be generally constant or moving slowly. During this operation in the first control mode, the control circuit processor 110 also conserves power by disabling the analog detector circuit 106 and the second sample hold circuit 108 until the model probability exceeds the first threshold TH1.

In this example, when the second sample signal 118 exceeds a second threshold TH2, the control circuit processor 110 switches to a second control mode and provides the first sampling control signal 112 to implement a higher sample rate SR for sampling the input signal VIN. This advances the model state. The processor 110 continues to implement the mode control program instructions 132 and the feature extractor sampling and data sampling instructions 133 and 134 in this fashion until the next model state transition is detected according to the second sample signal 118. During the second control mode operation, the processor 110 in one example continues to selectively enable and disable the analog detector circuit 106 at least partially according to the model 136, with the analog detector circuit 106 being enabled when the model 136 indicates the probability that the feature of the input signal VIN is greater than the first threshold TH1.

The model 136 in some examples includes more than two states, and the processor 110 can implement more than two different sample rates SR. The processor 110 in this example implements model state changes according to corresponding threshold comparisons of the second sample signal 118, and selectively enables the analog detector circuit 106 for sampling of its output signal 107 according to comparison of the model probability P with corresponding threshold values. In this manner, the sensor apparatus 100 provides intelligent sample rate adjustment based on the input signal feature sensed by the analog detector circuit 106, and also intelligently disables the analog detector circuit 106 based on the model representing the expected repeating waveform of the input signal VIN. The processor 110 provides the first sampling control signal 112 to control the sample rate SR of the AFE circuit 101 at least partially according to the second sample signal 118.

FIG. 2 shows another sensor apparatus IC example 100 including multiple analog detector circuits 106a and 106b enabled or disabled according to a corresponding enable signal 120a and 120b from the processor 110. In addition, the individual analog detector circuits 106a and 106b in FIG. 2 provide corresponding detector output signals 107a and 107b to corresponding sample hold circuits 108a and 108b, respectively. The sample hold circuit 108a is operated according to a sampling control signal 114a and the sample hold circuit 108b is operated according to a sampling control signal 114b.

In one example, the processor 110 in FIG. 2 provides the first sampling control signal 112 to control the AFE input signal sample rate SR at least partially according to the second sample signals 118a and/or 118b. In other embodiments, the processor 110 provides a control signal 121a to control an input gain of a gain in filter circuit 119 in the AFE circuit 101 at least partially according to the second sample signal 118 and the model 136.

In another example, the processor 110 provides a control signal 121b to control an input filter operating parameter of the gain and filter circuit 119 at least partially according to the second sample signal 118. For example, the processor 110 in one example controls a bandwidth of the filter circuit 119 at least partially according to the second sample signal 118.

In certain examples, the processor 110 provides corresponding control signals to control more than one operating parameter of the AFE circuit 101. For example, the processor 110 in FIG. 2 controls the input sampling rate by providing the first sampling control signal 112 according to a corresponding state of the model 136, and also controls one or both of the gain in filter parameters of the circuit 119 by providing the corresponding control signals 121a and/or 121b according to the current state of the model 136. Other operating parameters of the AFE circuit 101 can be controlled by the processor 110 to implement a variety of different sensor apparatus operating characteristics based on a model 136 that represents the expected repeating waveform of the input signal VIN in other embodiments.

Figure 3:
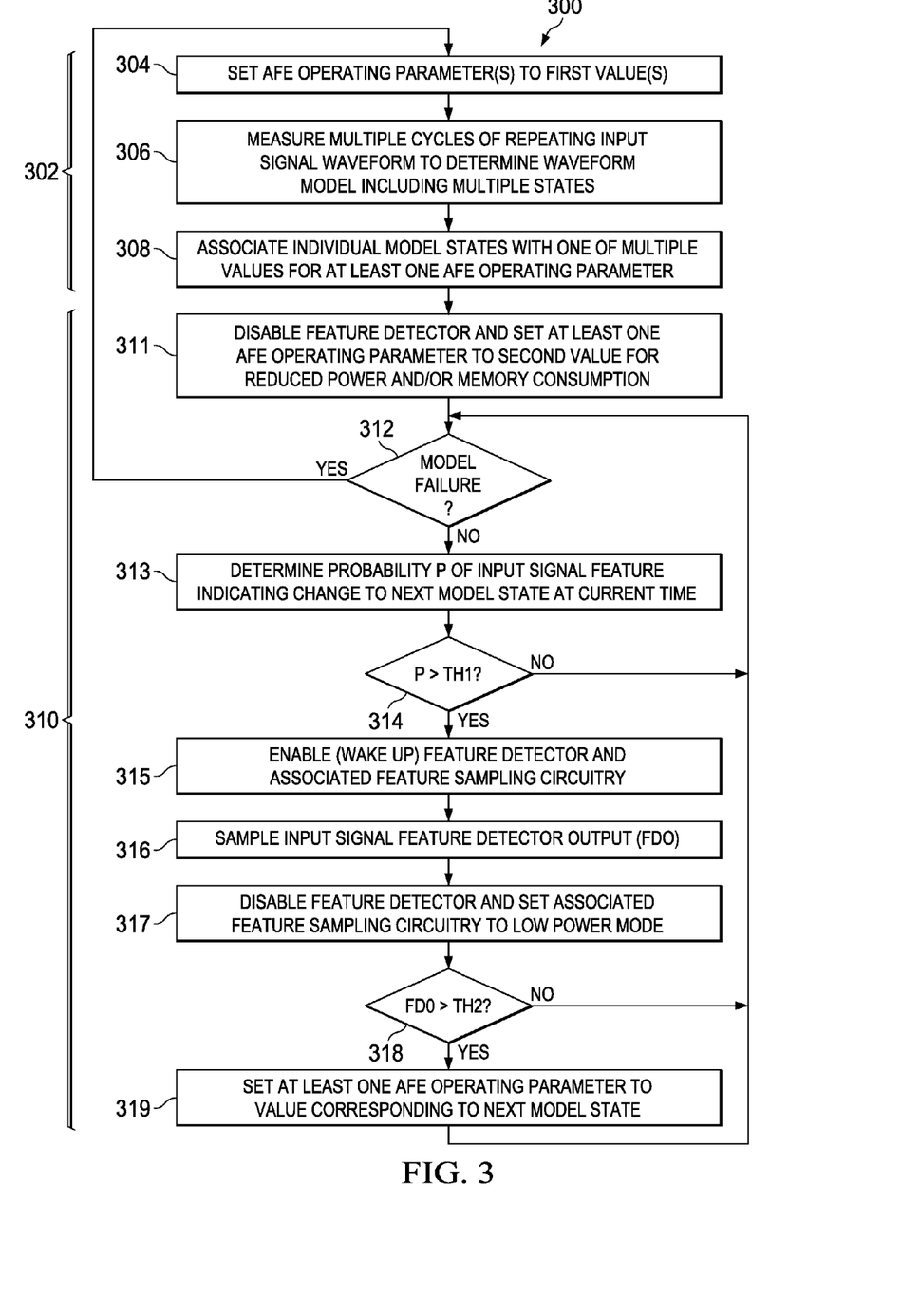
FIG. 3 is a flow diagram of a method of conserving power in a sensor circuit.

FIG. 3 illustrates an example process or method 300 for conserving power in a sensor circuit, which can be implemented by the control circuit processor 110 in FIGS. 1 and 2. The method 300 provides for operating an AFE circuit (e.g., circuit 101) at 310 in first and second control modes for normal processing (referred to also as a test mode) according to a model (e.g., Markov model 136 above). The method 300 also includes automatically determining or updating the waveform model (e.g., model 136 in FIGS. 1 and 2) in a third control mode (learning mode) at 302 in FIG. 3.

At 304 in FIG. 3, the processor 110 sets the AFE operating parameter or parameters to first values for learning mode operation to create or update the model 136. As mentioned above, one example of the apparatus 100 uses high and low sample rates SR during normal or "test" operation, with the processor 110 providing the first sampling signal 112 at a first low sample rate for low power operation in a first control mode for expected slow or static input signals, and at a second higher rate in a second control mode when higher accuracy conversion of a quickly changing (e.g., dynamic) expected input signal VIN. In one example, the learning is performed in a third control mode at 302 with the sample rate set to a high value. In one example in the third mode (learning mode) at 302 in FIG. 3, the control circuit processor 110 enables the analog detector 106 and provides the main signal channel sampling signal 112 the higher second sample rate at 304 for the measurements at 306 in order to optimize the modeling to create the model 136 at circuit power up or thereafter to update the model 136. Using the high sample rate during the third control mode facilitates the learning process and accurate creation or updating of the model 136 by obtaining high-resolution digital values 137 describing the repeating input signal waveform. In the learning mode at 302, the processor 110 obtains first sample signals 116 from the first sampling circuit 104 representing the input signal VIN at 306 in FIG. 3. The processor 110 in some examples also enables the analog detector circuit 106 and the second sample hold circuit 108 via the EN signal 120 in the learning operation, and samples the output signal 107 of the detector circuit 106 using any suitable sample rate during the third control mode. For example, the processor 110 may obtain samples of the detector output signal 107 at various points along an individual cycle of the input signal waveform VIN and correlate different identified model states with values and/or ranges of expected detector output signals 107 as part of the construction or updating of the model 136. The processing 302 in FIG. 3 can be employed at power up of the IC 100 and/or thereafter to either create the model 136 according to the first sample signals 116 obtained during operation in the third control mode 404, or to update the model 136 according to the first sample signals 116 obtained during operation in the third control mode 404. The second threshold TH2 is adjusted according to the feature sample signals 118 during model construction or updating in one example.

Figure 4:
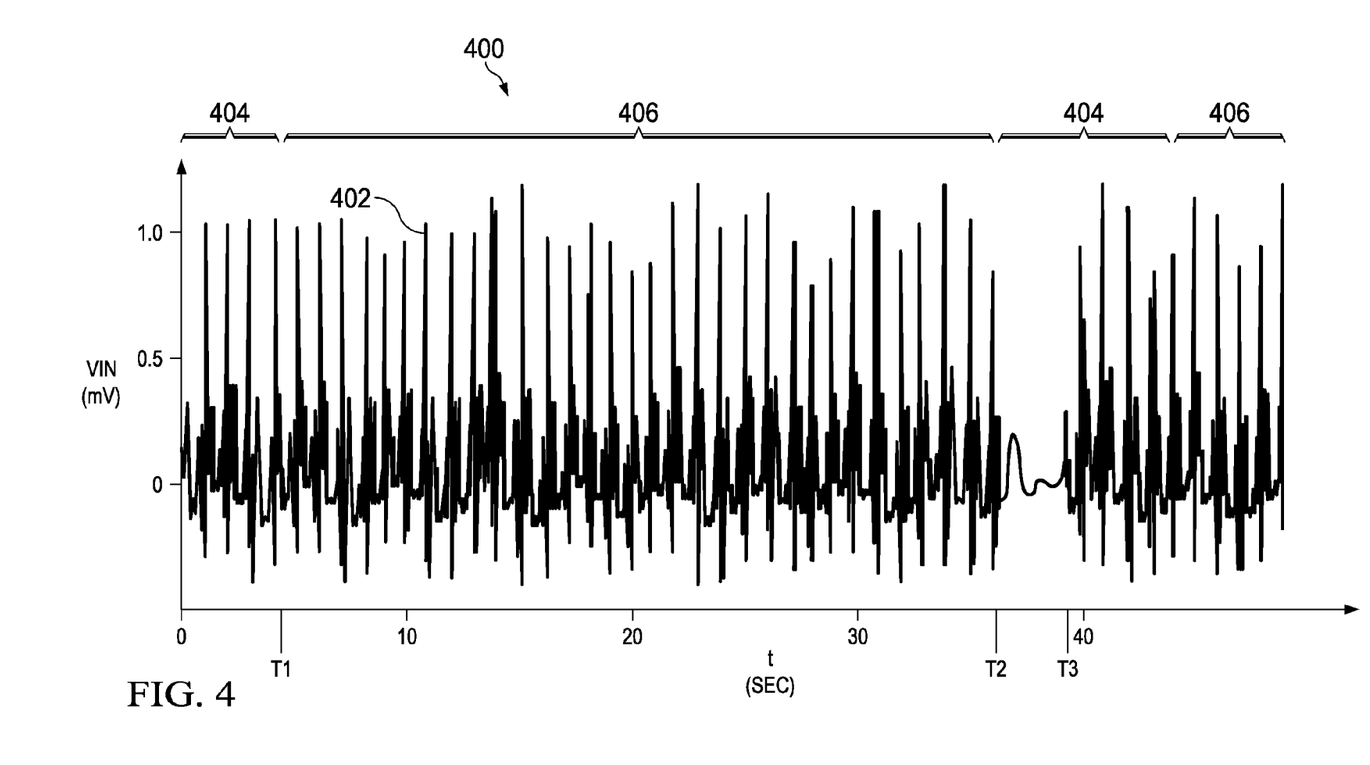
FIG. 4 is a graph of an input signal waveform during test operation and learning operation.
Figure 5:
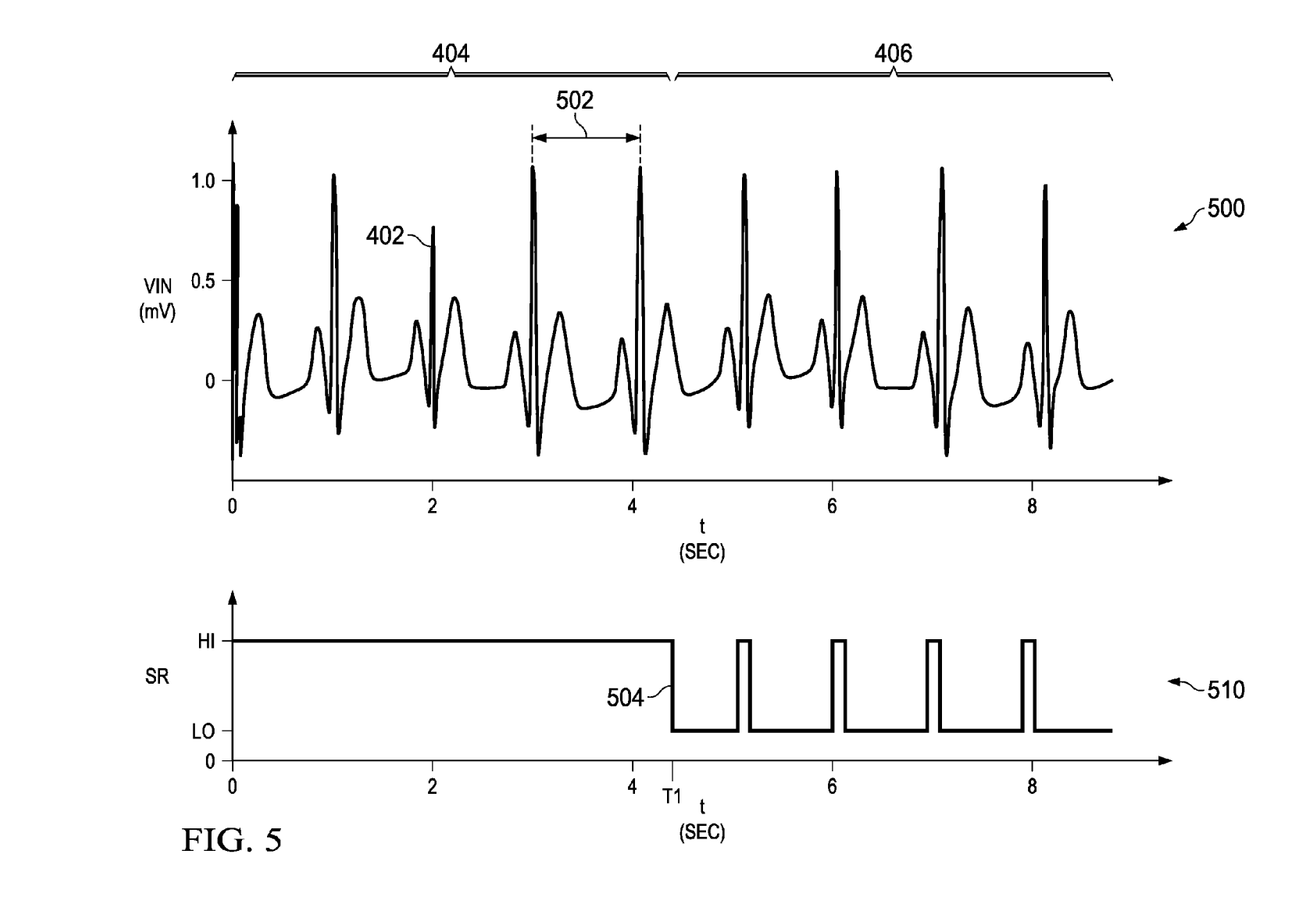
FIG. 5 is a graph showing several cycles of a repeating input waveform during learning operation and test operation.

Referring also to FIGS. 4 and 5, FIG. 4 shows a graph 400 illustrating an example ECG signal input waveform 402 (VIN) as a function of time, including an initial learning period 404 from t=0 through T1, for example, on power up of the integrated circuit apparatus 100, with the processor 110 operating the AFE circuit 101 in the third control mode for learning at 302 in FIG. 3 during the period 404 of FIG. 4. FIG. 5 illustrates a graph 500 showing further details of several cycles of the input waveform 402, which has an average cycle period 502 of approximately one second in this example. As seen in the graphs 400 and 500, the ECG input signal waveform 402 in this example is a generally periodic repeating signal waveform with some statistical deviation in the waveform shape, peak amplitudes and in the period 500 itself. Although the input waveform VIN is not strictly periodic, the waveform is generally described herein as a repeating waveform. FIG. 5 shows a graph 510 illustrating an example input signal sampling rate curve 504 which is set to a high sampling rate (HI) from t=0 through T1 during operation in the third control mode (learning mode 404), and is thereafter switched to a lower sampling rate (LO) at time T1 by the processor 110.

Continuing at 308 in FIG. 3, once sufficient measurements of multiple cycles of the repeating input signal waveform VIN have been obtained to determine or update the model 136, the processor 110 associates individual model states with one or more AFE operating parameter values, and stores the constructed or updated model 136 in the data portion 135 of the electronic memory 130 (e.g., FIGS. 1 and 2). One or more AFE operating parameters are associated with different states of the model 136. For example, the model 136 may provide a correlation between different model states and one or more features or characteristics of the input signal VIN, including without limitation a rate of change of the input signal VIN, an RMS value associated with the input signal VIN, an absolute value of the input signal VIN, an energy of the input signal VIN, etc. In addition, the different states of the model 136 can be correlated with different AFE operating parameter levels or values, with the processor 110 selectively setting one or more AFE operating parameters to a value corresponding to a model state in order to facilitate power conservation in the apparatus 100 or other operational goal. For example, the processor 110 can selectively adjust input signal sample rate by controlling the first sampling control signal 112 for a given state according to the model 136 and/or the processor 110 can set or adjust different gains or filter bandwidths using the control signals 121a and/or 121b according to the current model state. In addition, the processor 110 in some examples selectively enables and disables the analog detector circuit 106 to obtain feature extractor detector output signals 107 at least partially according to the model 136, and selectively updates the model state according to corresponding samples or readings of the detector output signal 107.

Continuing at 310 in FIG. 3, the processor 110 then switches to the first or second control modes at time T1, where this operation is referred to as a normal or "test" mode shown as 406 in FIGS. 4 and 5. In one example at 311 in FIG. 3, the processor 110 lowers the sample rate at T1 to the second or low value (e.g., sample rate curve 504 LO in graph 510 of FIG. 5), and disables the analog detector circuit 106 via the EN signal 120 to reduce power consumption. In this manner, the control circuit processor 110 implements the first operating mode with the sample rate of the input signal VIN tailored to conserve AFE circuit power while providing an adequate number of samples of the first sample signal 116 to the processor 110 according to the expected slow or generally static state of the input voltage signal VIN based on the model 136. The normal or "test" operation 406 is shown in the graphs 400 and 500 with the control circuit processor 110 selectively switching between the first and second control modes according to the second sample signal 118 representing the detector output signal 107.

At 312 in FIG. 3, the processor 110 determines whether there is a discrepancy between the model 136 and the received first sample signals 116 indicating a model failure. If recently obtained first sample signals 116 disagree with the model 136 (YES at 312), the processor enters or resumes the third control mode at 302 in FIG. 3 (404 in FIGS. 4 and 5) when such a model failure is detected. This allows the processor 110 to read and evaluate the incoming signal values VIN to update the model 136 at 304-308 as described above. This is shown at time T2-T3 in FIG. 4, where the input signal VIN for some reason deviates from a normal or expected pattern of repeating waveforms for a brief time. In this situation, the processor 110 detects a model failure (YES at 312 in FIG. 3), and reverts to the learning mode 404 until the model 136 is reestablished or updated, after which normal or "test" mode operation 406 is resumed as shown at time T3 in the graph 400.

If no model failure is detected (NO at 312), the processor 110 continues operation in the first control mode at 313 and determines the probability "P" that the relevant feature of the input signal VIN (e.g., energy, RMS, rate of change) is greater than a first threshold TH1 or otherwise indicates an expected state change in the model 136. In one example, the processor 110 identifies a specific point in the repeating input signal waveform (e.g., peak 602 in FIG. 6 below) based on the input samples 116, and the processor 110 determines an expected input signal value at the current time based on the elapsed time since the specific point 602 was detected. Using the model 136, the processor 110 determines the probability P at 313 that one or more assessed features of the input signal (from the feature detector circuit 106) will confirm that the actual input signal waveform has reached a point corresponding to the next model state. In certain examples, this is done by comparison of the most recent sample of the detector output signal 107 with one or more thresholds (e.g., TH1 in FIG. 6). The threshold used for a given comparison may in certain examples depend upon the current model state (e.g., different thresholds can be used at different points in the modeled waveform, individually corresponding to different states of the model 136).

At 314, the processor 110 in a dual state model example determines whether the probability value P indicated by the model 136 is greater than a first threshold TH1. If not (NO at 314), the processing continues in the first (e.g., low-power) control mode with the analog detector circuit 106 disabled and the input signal VIN sampled at a low sampling rate.

Once the model 136 indicates a probability P exceeding the threshold TH1 (YES at 314 in FIG. 3), the processor 110 obtains a new sample of the detector output signal 107. At 315 in FIG. 3, the processor 110 enables (e.g., wakes up) the analog detector circuit 106 using the EN control signal 120, and also enables any associated feature sampling circuitry (e.g., the second sampling circuit 108 in FIG. 1). At 316, the processor 110 samples the output 107 of the feature detector circuit 106, and then disables the analog detector circuit 106 at 317 and sets any associated sampling circuitry 108 to a low power mode. The selective verification of the probability P at 314 thus allows the processor 110 to preferentially operate the sensor apparatus 100 in low-power fashion until the model 136 indicates that the analog detector circuit 106 is likely to yield a sample value 107, 118 indicating that the model 136 should be advanced to the next date, and thus cause any associated AFE operational parameter changes as set by the correlation of the AFE operation to the model 136. This intelligent power saving operation advantageously saves power compared to simply maintaining the analog detector circuit 106 and a high power consumption (enabled) mode continuously.

At 318, the processor 110 determines whether the sampled feature detector output (FDO) of the second sample 118 (representing the detector output signal 107) exceeds a second threshold TH2 or otherwise indicates that the monitored feature of the input signal VIN indicates transition to the next date of the model 136. In this regard, the first threshold TH1 is a probability threshold, whereas the second threshold TH2 in this example is a signal feature threshold indicative of model state transition. If the second sample signal 118 is less than or equal to the second threshold (FDO≤TH2, NO at 318), the processor 110 continues operation in the first control state for low-power operation without changing to the next model state. The processor 110 then again determines whether a model failure has been detected at 312 and again assesses the probability P at 314 that a subsequent sampling of the detector output signal 107 could indicate a model state change.

If the second sample signal 118 is greater than the second threshold (FDO>TH2, YES at 318), the processor 110 selectively switches from the low-power first control mode (e.g., SR curve 504 at the LO level in graph 510 of FIG. 5) to the second control mode (SR curve 504 switched again to the HI level in graph 510). In this example, the sampling rate SR of the main input signal VIN is increased, when the next anticipated state of the input signal waveform is expected to include dynamic changes in the input signal VIN. In general, the processor 110 advances the model 136 to the next state, and sets at least one AFE operating parameter to a corresponding value for the next model state at 319 in FIG. 3, and the process returns to again check for a model failure at 312 as described above. Thereafter, subsequent comparison of the second sample signal 118 from the AFE circuit 101 with corresponding thresholds determined by the model 136 may yield further model state transitions to again place the control in the first control state for low sampling rate operation as shown by the transitions in the graph 510 between low and high sample rates, which correspond in this example with low and high dynamic changes in the corresponding input signal waveform VIN as shown in the graph 500. For one ECG example, this allows high sampling around the peaks of the input signal waveform which can be used to accurately identify a peak value for computing an accurate heart rate value, with the processor 110 in one example comparing the time between peaks of adjacent cycles of the signal VIN to compute the heart rate value which can be provided to an external host device 128.

Figure 6:
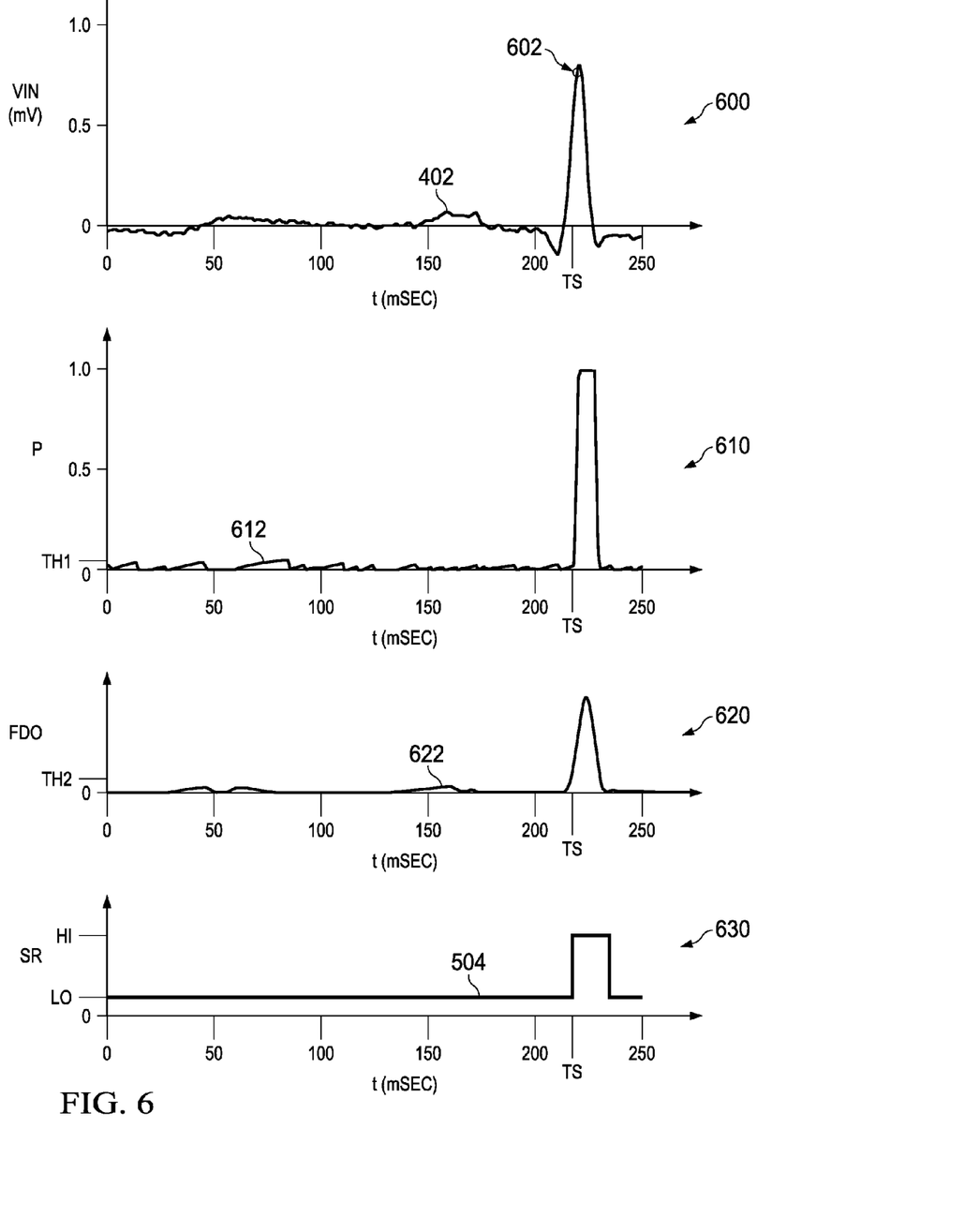
FIG. 6 provides graphs of input signal voltage, model-based probability, feature detector output and sample rate waveforms in the sensor apparatus of FIG. 1.

Referring now to FIG. 6, graphs 600, 610, 620 and 630 respectively illustrate one representative cycle of an input signal waveform VIN. In this case, the graph 600 shows the curve 402 of the input signal waveform VIN including a peak 602, graph 610 shows a model probability P (curve 612), graph 620 shows a frequency detector output (FDO, curve 622), and graph 630 shows a corresponding sample rate curve 504 (SR) controlled by the processor 110. In this example, the feature extractor or analog detector circuit 106 provides an output signal 107 representing an energy of the input signal VIN, with the curve 622 representing the energy of the input waveform 402 in FIG. 6. As this signal feature (energy) changes across time windows associated with the model 136, the probability curve 612 gradually increases until the threshold TH1 is exceeded. The processor 110 responds by enabling the analog detector circuit 106 and obtaining a corresponding sample 118 for comparison with the second threshold TH2 shown in the graph 620. The probability curve 612 in FIG. 6 generally ramps up until the threshold TH1 is exceeded, and subsequent verification of the corresponding FDO curve 622 by waking up the analog detector circuit 106 and obtaining a sample 118 repeatedly shows that the detected feature is not indicative of an upcoming model state change (FDO remains below the threshold TH2). As a result, the probability curve 612 (P) again returns to zero and begins ramping up again.

In the illustrated example of FIG. 6, this process repeats many times until an actual sample time indicated as "TS" at approximately 212 ms where the feature detector output sample 118 (FDO) exceeds the second threshold TH2. In response, the processor 110 advances the state of the model 136 and changes operation to the second control mode by elevating the input signal sample rate SR shown as a step change upward in the sample rate curve 500 for in the graph 630. The same process repeats for the now-current model state, with the control circuit processor 110 detecting that the energy signal represented by the feature detector output (curve 622) eventually falls below the threshold TH2, and the processor 110 then switches to the next model state, in this example, reverting back to the first control mode and the corresponding low sample rate SR.

In the described examples, the sensor apparatus 100 provides control circuitry 110, 130 and an analog front-end circuit 101 that intelligently automatically learns or updates the model 136 used to track system states and to predict a transition to a next state. In one example, a Markov model is used to capture states and state transition probabilities, but other modeling examples are possible. Importantly, the described examples use prediction to preemptively adjust sample rate or other AFE operational parameters (e.g., input sample rate, gain adjustment, filter parameters, etc.), with the model-based prediction advantageously compensating for any circuit settling time in the analog signal chain. The detection of a state error in the evaluated analog features can identify a model failure with the apparatus 100 automatically reverting to training or learning mode in order to update or create a new model 136, thereafter reverting back to intelligent power saving test operation according to the updated model 136.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims. In addition, although a particular feature of the disclosure may have been disclosed with respect to only one of multiple implementations, such feature may be combined with one or more other features of other embodiments as may be desired and advantageous for any given or particular application.

The following is claimed:

1. A sensor apparatus, comprising:
  an analog front end circuit, including:
   an input circuit to receive an input signal,
   a first sampling circuit coupled to sample the input signal from the input circuit and to provide a first sample signal representing the input signal according to a first sampling control signal,
   an analog detector circuit coupled to receive the input signal from the input circuit, the analog detector circuit operative when enabled to provide a detector output signal representing a feature of the input signal, and
   a second sampling circuit coupled to sample the detector output signal from the analog detector circuit and to provide a second sample signal representing the detector output signal according to a second sampling control signal; and
  a control circuit coupled to provide the first and second sampling control signals to the analog front end circuit and to receive the first and second sample signals from the analog front end circuit, the control circuit operative to control at least one operating parameter of the analog front end circuit at least partially according to the second sample signal, and to selectively enable and disable the analog detector circuit at least partially according to a model representing an expected repeating waveform of the input signal.

2. The sensor apparatus of claim 1, wherein the control circuit is operative to provide the first sampling control signal to control a sample rate of the analog front end circuit at least partially according to the second sample signal.

3. The sensor apparatus of claim 2, wherein the control circuit is operative to provide a control signal to control at least one of (i) an input gain, and (ii) an input filter operating parameter of the analog front end circuit at least partially according to the second sample signal.

4. The sensor apparatus of claim 2:
  wherein the control circuit is operative to selectively disable the analog detector circuit to place the analog detector circuit in a low power condition when the model indicates a probability that the feature of the input signal is less than or equal to a first threshold; and
  wherein the control circuit is operative to selectively enable the analog detector circuit and provide the second sampling control signal to obtain the second sample signal from the second sampling circuit when the model indicates the probability that the feature of the input signal is greater than the first threshold.

5. The sensor apparatus of claim 4:
  wherein the control circuit is operative to provide the first sampling control signal to set the sample rate of the analog front end circuit to a first sample rate in a first control mode when the second sample signal indicates that the feature of the input signal is less than or equal to a second threshold;
  wherein the control circuit is operative to provide the first sampling control signal to set the sample rate of the analog front end circuit to a second sample rate in a second control mode when the second sample signal indicates that the feature of the input signal is greater than the second threshold; and
  wherein the second sample rate is higher than the first sample rate.

6. The sensor apparatus of claim 5:
  wherein the control circuit is operative in a third control mode to:
   enable the analog detector circuit,
   set the sample rate of the analog front end circuit to the second sample rate,
   obtain first sample signals from the first sampling circuit representing the input signal, and
   at least one of (i) create the model according to the first sample signals obtained during operation in the third control mode, and (ii) update the model according to the first sample signals obtained during operation in the third control mode;
  wherein the control circuit is operative to enter the third control mode at least one of (i) responsive to power up of the sensor apparatus, and (ii) when recently obtained first sample signals disagree with the model; and
  wherein the control circuit is operative to exit the third control mode and enter one of the first and second control modes when the model is created or updated.

7. The sensor apparatus of claim 4, wherein the analog detector circuit is operative when enabled to provide the detector output signal representing an energy of the input signal.

8. The sensor apparatus of claim 4, wherein the analog detector circuit is operative when enabled to provide the detector output signal representing a rate of change of the input signal.

9. The sensor apparatus of claim 4, wherein the analog detector circuit is operative when enabled to provide the detector output signal representing a root mean square (RMS) of the input signal.

10. The sensor apparatus of claim 2:
  wherein the control circuit is operative to provide the first sampling control signal to set the sample rate of the analog front end circuit to a first sample rate in a first control mode when the second sample signal indicates that the feature of the input signal is less than or equal to a second threshold;
  wherein the control circuit is operative to provide the first sampling control signal to set the sample rate of the analog front end circuit to a second sample rate in a second control mode when the second sample signal indicates that the feature of the input signal is greater than the second threshold; and
  wherein the second sample rate is higher than the first sample rate.

11. The sensor apparatus of claim 10:
  wherein the control circuit is operative in a third control mode to:
   enable the analog detector circuit,
   set the sample rate of the analog front end circuit to the second sample rate,
   obtain first sample signals from the first sampling circuit representing the input signal, and at least one of (i) create the model according to the first sample signals obtained during operation in the third control mode, and (ii) update the model according to the first sample signals obtained during operation in the third control mode;

wherein the control circuit is operative to automatically enter the third control mode at least one of (i) responsive to power up of the sensor apparatus, and (ii) when recently obtained first sample signals disagree with the model; and wherein the control circuit is operative to automatically exit the third control mode and enter one of the first and second control modes when the model is created or updated.

12. The sensor apparatus of claim 1, wherein the control circuit is operative to provide a control signal to control at least one of (i) an input gain, and (ii) an input filter operating parameter of the analog front end circuit at least partially according to the second sample signal.

13. The sensor apparatus of claim 1:
wherein the control circuit is operative in a learning mode to:
enable the analog detector circuit,
set the sample rate of the analog front end circuit to the second sample rate,
obtain first sample signals from the first sampling circuit representing the input signal, and
at least one of (i) create the model according to the first sample signals obtained during operation in learning mode, and (ii) update the model according to the first sample signals obtained during operation in the third control mode;
wherein the control circuit is operative to enter the learning mode at least one of (i) responsive to power up of the sensor apparatus, and (ii) when recently obtained first sample signals disagree with the model; and
wherein the control circuit is operative to exit the learning mode and enter one of the first and second control modes when the model is created or updated.

14. The sensor apparatus of claim 1, wherein the analog detector circuit is operative when enabled to provide the detector output signal representing an energy of the input signal.

15. The sensor apparatus of claim 1, wherein the analog detector circuit is operative when enabled to provide the detector output signal representing a rate of change of the input signal.

16. The sensor apparatus of claim 1, wherein the analog detector circuit is operative when enabled to provide the detector output signal representing a root mean square (RMS) of the input signal.

17. The sensor apparatus of claim 1, wherein the model is a Markov model.

18. The sensor apparatus of claim 1, wherein the control circuit comprises:
a memory storing the model; and
a processor programmed to control the at least one operating parameter of the analog front end circuit at least partially according to the second sample signal, and to selectively enable and disable the analog detector circuit at least partially according to the model.

19. An integrated circuit (IC), comprising:
an analog front end circuit, including:
a first sample hold circuit operative according to a first sampling control signal to sample an input signal and to provide a first sample signal representing the input signal,
an analog detector circuit operative to provide a detector output signal representing a feature of the input signal, and
a second sample hold circuit operative according to a second sampling control signal to sample the detector output signal from the analog detector circuit and to provide a second sample signal representing the detector output signal;
a memory storing a model of a repeating waveform associated with the input signal; and
a processor programmed to:
receive the first and second sample signals from the analog front end circuit,
provide the first sampling control signal to control a sample rate of the analog front end circuit at least partially according to the second sample signal, and
selectively enable and disable the analog detector circuit and provide the second sampling control signal to the analog front end circuit at least partially according to the model.

20. A method of conserving power in a sensor circuit, the method comprising:
automatically determining a waveform model at least partially according to a sampled input signal;
disabling an analog feature detector circuit while sampling the input signal at a first sample rate;
selectively enabling the analog feature detector circuit and sampling a feature detector circuit output signal representing a feature of the input signal when the model indicates a probability that the feature detector circuit output signal is greater than a threshold;
disabling the analog feature detector circuit after sampling the feature detector circuit output signal; and
selectively sampling the input signal at a higher second sample rate if the sampled feature detector circuit output signal exceeds a second threshold associated with the model.

* * * * *